United States Patent [19]

Zega

[11] Patent Number: 4,684,536
[45] Date of Patent: Aug. 4, 1987

[54] HARD LAYER FORMED BY INCORPORATING NITROGEN INTO MO OR W METAL AND METHOD FOR OBTAINING THIS LAYER

[75] Inventor: Bogdan Zega, Geneva, Switzerland

[73] Assignee: Battelle Development Corporation, Columbus, Ohio

[21] Appl. No.: 681,856

[22] Filed: Dec. 6, 1984

[30] Foreign Application Priority Data

Apr. 18, 1983 [CH] Switzerland ..................... 2058/83

[51] Int. Cl.$^4$ ............................................. C23C 15/00
[52] U.S. Cl. ................................. 427/47; 204/192.31; 428/698
[58] Field of Search ............................... 428/698, 699; 204/192 N; 427/47

[56] References Cited

U.S. PATENT DOCUMENTS 4,116,791 9/1978 Zega ............................... 204/192 N
4,497,878 2/1985 Natano et al. ...................... 428/698

FOREIGN PATENT DOCUMENTS 0154562 12/1980 Japan .................................. 428/698

Primary Examiner—Nancy A. Swisher
Attorney, Agent, or Firm—Barry S. Bissell

[57] ABSTRACT

This hard layer is obtained by incorporating a maximum of 2 weight % of nitrogen in Mo or W by the technique of cathode sputtering in a nitrogen reactive medium, the temperature at which the nitrogen incorporation occurs which is in the order of 300° C. preventing the nitrogen to precipitate at the grains-joints during cooling, so that the layer only comports a cubic centered Mo or W phase, thus preserving its own ductility to the metal.

5 Claims, 2 Drawing Figures

HARD LAYER FORMED BY INCORPORATING NITROGEN INTO MO OR W METAL AND METHOD FOR OBTAINING THIS LAYER

The present invention relates to a hard layer formed by incorporation of nitrogen into molybdenum or tungsten metal and to a method for obtaining this layer.

"Hard" chromium layers deposited by galvanic techniques are known, the hardness of which arises from the incorporation of hydrogen during the electrolytic plating process thereto. In view of their hardness, these coatings enable to considerably improve the wear resistance of mechanical parts. The hardness of these layers generally range around 1000 VH and can reach 1200 VH. However these "hard" chromium coatings lose their hardness as the temperature increases because of a loss of the hydrogen atoms therein.

Because of the shortcomings of galvanic methods, namely the brittleness of the substrate obtained therefrom due to the presence of atomic hydrogen, the cost of the baths and the pollution problems caused by the reduction of hexavalent chromium as well as the low yields from these baths, there has already been proposed to use a PVD method (physical vapor deposition) to form chromium coatings by bringing into action this method by means of a magnetron cathode sputtering installation. It has been proposed to increase the hardness of such layer by incorporating therein 0.2 to 3% of nitrogen, phosphorus, boron, silica, carbon in solid solution with chromium which, as one knows, have an important influence on the hardness of the latter. These accomplishments are discussed in the following article: "Hard Chromium Coatings Deposited by Physical Vapour Deposition" in the form of a communication of 14-16.9.82 at the Conference of "The Metal Society" held at WARWICK University, Coventry, as well as in FR-A-2.512.070

Incidentally, chromium is so sensitive to these impurities that, under practice, that what is normally called pure chromium, i.e. chromium from 99.9 to 99.999 pure, is not sufficiently ductile and malleable to be machined, therefore targets for cathode sputtering must be made by very high pressure sintering. There are risks of cracks during the manufacturing of targets by vacuum casting. Yet, a cracked target cannot be cooled by direct contact during sputtering and therefore it is of no industrial interest. Consequently, the commercially available targets are exclusively constituted by plates and their cost depending on size and purity is extremely high and limits their employment to using a flat magnetron, thus decreasing strongly the industrial field of application.

On the other hand, very hard (2800-3000 VH) coatings are known which are formed from nitrides or carbides of titanium or of other transition metals. They can be obtained by CVD (Chemical vapor deposition) if the substrate sustains the treatment's rather high temperature (1000°-1200° C.) like in the case of cemented carbide machining tools. The same kind of coating can be obtained at a lower temperature (~500° C.) by PVD methods compatible with high speed hardened steels.

The crystalline structure of hard nitrides and carbides generally designated by the term "interstitial" combines certain properties common to metals (electrical conductivity, optical reflectivity) and others inherent to ionic or intermetallic crystals (hardness, defined chemical formula). However, contradistinctively to the majority of metals, their ductility is practically naught which imposes certain limits to their use everywhere there exists a risk of deformation of the substrate under the effect of a too strong local constraint.

It is known that molybdenum has a centered cubic structure and possesses, at high temperature, the property of absorbing and dissolving the nitrogen of the surrounding medium to a degree proportional to the square root of the nitrogen pressure and as a function of temperature. Although the solubility of nitrogen in molybdenum is very small, it results that, after cooling, molybdenum becomes very frangible and this even more so if molybdenum is polycrystalline rather then monocrystalline. This phenomenon is explained by the fact that under cooling nitrogen precipitates at the grain boundaries which renders the metal extremely brittle.

It has to be noted that what has been said above for molybdenum is also true for tungsten whose behavior and properties are very similar.

Pure molybdenum has a hardness of 150-250 HV and is used because of its good resistance to wear, namely for coating the synchromesh rings in automobile gear boxes. These deposits are applied by spraying with an oxyacetylene spray-gun then they are machined. These deposits have a slightly porous structure resulting from the application mode which favorises lubrication. Contrariwise, metallic molybdenum has no particular hard properties for being used as a hard coating except in the form of $Mo_2N$ which is very frangible.

The applicant has discovered the possibility of incorporating nitrogen to a molybdenum or tungsten layer without forming nitrides and by operating at a temperature sufficiently low to prevent the effect of precipitation at the grain boundaries under cooling. The phase diagram of such a layer analyzed by X-ray diffraction indicates the existence of a Mo phase without nitride phase. Such a layer is thus formed of a metal and preserves at least in part the ductility thereof although with a hardness which can possibly range from about 600 to 4000 VH.

Further, and as will be seen in detail hereinafter, by comparing the X-ray diffraction analysis of two series of PVD samples achieved with the same magnetron sputtering installation and using chromium and molybdenum targets at varied nitrogen partial pressures, it was shown that, unexpectedly, the Mo+N layer has orientation planes (1 1 0) nearly perfectly parallel to the sample's surface, whereas the Cr+N layer has orientation planes (1 0 0) parallel to the sample's surface. Both Cr and Mo have a body-centered structure in which the plane (1 1 0) has the higher atomic density (1.75 in comparison with the plane (1 0 0) rating at 1.0). It is well known that planes with the highest atomic density have the best frictional properties end, in fact, the friction coefficient of Mo+N rapidly decreases during the initial "run-in" period and stabilizes at a considerably lower value than Cr+N layers. The greater atom density in the planes (1 1 0) which is 1.75 versus 1 for the planes (1 0 0) provides better frictional properties.

Consequently, the object of the invention is a hard layer according to claim 1 and a method according to claim 4 for obtaining this layer.

This invention provides several other advantages, for instance the possibility of operating by PVD without a bath and consequently without pollution problems. In regard to chromium, molybdenum and tungsten have the great advantage to undergo, under certain conditions, all classic mechanical forming operations such as laminating, forging, extruding, machining and drilling, the hardness of these metals being about that of steel. Even the softest chromium which can be obtained in form of plates or ingots by the usual metallurgical techniques can not be mechanically machined because of brittleness. This is why the cathode sputtering targets must be manufactured by high pressure sintering and are utmost expensive and are practically limited to flat surfaces.

Now, and this is surprising, the layers of Mo or W with nitrogen incorporation are obtained from targets whose hardness is comparable to steel and which can be flat but also cylindrical, for instance they can be obtained under certain conditions by classic drawing techniques. The layer thus obtained has a hardness which can reach values of 2000 HV while maintaining a certain ductility contradistinctively with the nitrides. In addition, these coatings keep their ductility up to temperatures in the order of 600° C.

This ductility and the possibility of making targets, namely in form of tubes, allows so apply the invention in very wide fields and enables, namely, to deposit hard layers inside of cylindrical surfaces and on surfaces subjected to local constraints where nitride layers would be inadequate. The applications of such layers are many and one can recite, for example, bearings, ball-bearings, anti-friction coatings, guides, sliding blocks, pump and engine cylinders, piston rings, moulds and extruder's parts subjected to wear and tear by filled plastics and the like.

The inside wall of tubes can be coated down to a diameter of about 50 mm by using a cylindrical sputtering cathode whose efficiency is magnetically increased as disclosed in U.S. Pat. No. 4,374,722 to the same inventor.

Other advantages of the present invention will be apparent from the following description which illustrates, by way of Examples, several embodiments of the method for obtaining hard layers according to this invention.

The annexed drawing represents two comparative diagrams of layers of Cr+N and Mo+N obtained under the same conditions.

Figure 1:
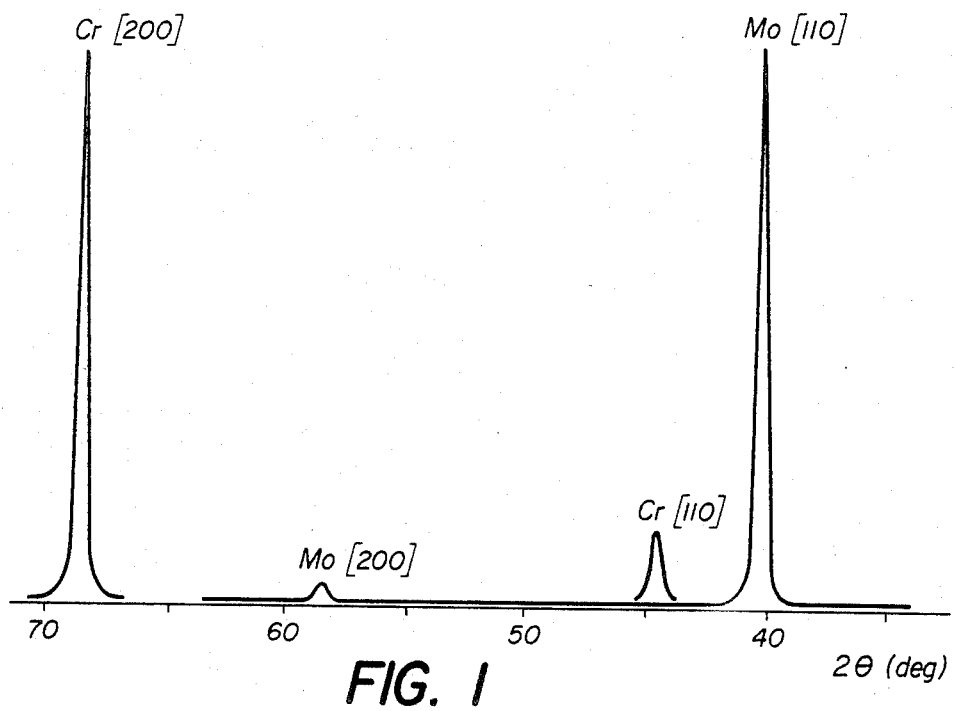
FIG. 1 is a diagram of X-ray diffraction.

The installation used for making the samples comprises a vacuum enclosure for containing a magnetron cathode constituting the target located in facing relation to a substrate to be coated, the latter being also negatively polarizable but to a lower voltage than that of the target.

Example 1

The substrate is constituted by a stainless steel plate 18/8. The target is made of technically pure Mo affixed to a magnetron cathode whose erodable area has 100 cm$^2$. The magnetic field intensity at the surface of the target (horizontal component) is at least 500 Oe. The distance between the substrate and the target is 35 mm. The enclosure is emptied down to a pressure of $5.10^{-3}$ Pa after which Ar is introduced therein to provide a pressure of 14 Pa. The substrate is then supplied with a voltage from a high voltage source and subjected to a 4 min period of Ar ion bombardment due to the discharge thus produced (voltage 2.5 KV; power 2 W/cm$^2$). At the end of this period, the temperature of the substrate has increased to about 300° C.

Thereafter, the voltage on the substrate is cancelled, the magnetron is supplied with a current of 5 A (460 V, 23 W/cm$^2$), the Ar pressure is reduced to 0.3 Pa and a nitrogen flow is introduced to a partial pressure of 0.12 Pa. The gases are mixed together before being introduced into the enclosure.

After 30 min deposition time, the magnetron is stopped and the sample is cooled. The deposited layer has 20 $\mu$um thickness and its hardness measured by means of a micrometer (scratch-test) is 1800 Knoop at 50 g, 1650 at 100 g and 1300 at 200 g.

In the scratching-test, the layer behaves as a ductile metal and does not show the characteristic brittleness of a nitride phase.

The diagram from X-ray diffractography (Cu K$\alpha$ beam) shows exclusively the Mo peaks (body-centered cubic) with a strong alignment parallel to the surface of the sides (1 1 0) and an increase of crystallographic parameters due to the dissolved nitrogen.

The nitrogen content is 1.58% by weight from analysis.

Example 2

The operating conditions are as in Example 1, except for the nitrogen pressure which is increased to 0.15 pa. The Knoop hardness (HK) of the layer is 2800 at 50 g; 2580 at 100 g and 1660 at 200 g.

In the scratch-test, the layer is still ductile and not brittle; this is confirmed by the X-ray diffraction diagram which, as before, corresponds to that of Mo with even more increased crystallographic parameters.

Example 3 (comparative)

Under the same conditions as in the previous Examples, the nitrogen flow was increased to a pressure of 0.20 Pa. The layer obtained has a even increased HK hardness: 3600–4000 at 50 g; 2800 at 100 g; 2320 at 200 g.

However this layer is brittle in the scratch-test. The X-ray diffraction diagram shows the existence of an important quantity (~50%) of the Mo$_2$N-$\gamma$ phase. Therefore the comparative Example shows that the nitrogen pressure exceeds the conditions pertaining to the hard layer of the invention.

Example 4 (comparative)

Still operating under the same conditions are previously but in the absence of any nitrogen, the obtained layer has a HK hardness under the same loads comprised between 250 and 330. This comparative Example illustrates the importance of nitrogen incorporation in Examples 1 and 2 as compared with the pure Mo Deposit.

Still for comparison purposes, Mo was deposited with an oxy-acetylene spray-gun. This layer is porous and contains oxide inclusions. Its hardness is from about 800 to 1000 VH. A "plasma-jet" deposit achieved in a protective N$_2$ atmosphere is denser and purer. Its hardness is about 600 VH.

The friction parameters of layers deposited according to Examples 1 and 2 are measured on a pin-and-disc machine using a 5 mm sapphire ball as "pin", motor-oil as lubrican and a linear speed of 1 cm/sec. The friction coefficient which was initially 0.1 decreases rapidly and becomes stable at above 0.07. Comparatively, the same test of a Cr layer provides a stable friction coefficient of 0.11.

Example 5

The general conditions of Example 1 are used again but with a W target and a $N_2$ partial pressure of 0.15 Pa. The resulting layer has the following HK hardness: 2100 at 50 g; 1900 at 100 g and 1700 at 200 g.

The X-ray diffraction phase diagram shows the only presence of W peaks (centered cubic phase) and the nitrogen analysis gives a value of 1.3%.

Figure 2:
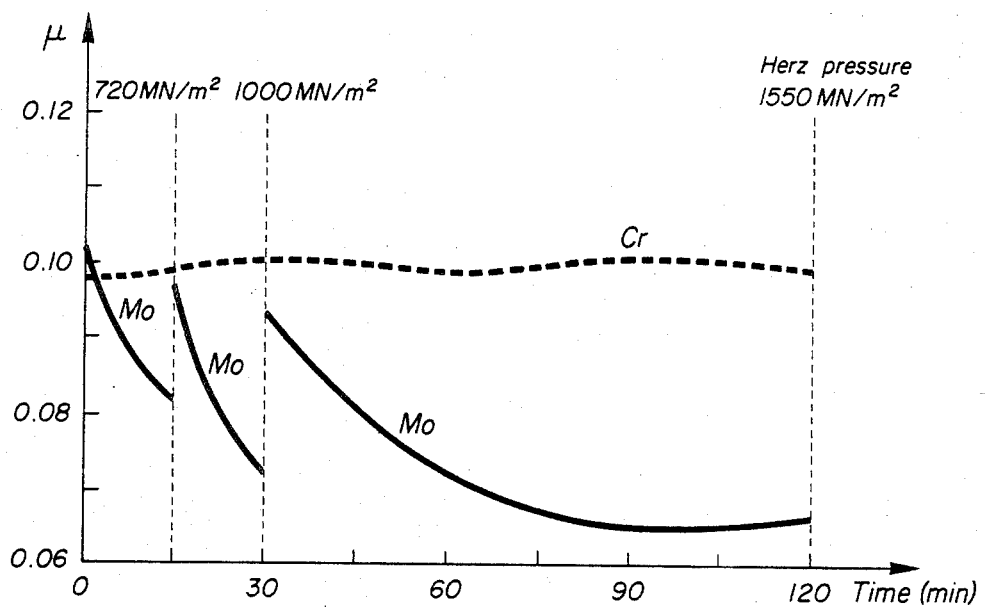
FIG. 2 is a diagram where the friction coefficient is plotted as a function of time.

The diagrams of FIGS. 1 and 2, respectively, relate to a comparison between coatings of Cr+N and Mo+N. These coatings have been deposited in the same enclosure, with the same planar magnetron and under analogous coating conditions. Two series of 2×5 samples, each with different nitrogen content have been prepared. Each sample has been deposited on a disc of 45 mm diameter for the friction measurements and on a disc of 16 mm diameter for the X-rays diffraction analyses.

The partial nitrogen pressure was controlled with an electronic flowmeter. The thickness of the deposit ranges from 8 to 13 microns.

FIG. 1 indicates that the essential difference between the two series of samples resides in the orientation of the crystallographic planes. Thus, one remarks on this diagram a nearly perfect orientation (1 1 0) of these planes in a direction parallel to the surface in the case of Mo while Cr shows an orientation (1 0 0) in a direction parallel to the surface. One knows that the higher the atomic density along the crystallisation plane, the weaker the friction coefficient. This is specifically what is observed on the diagram of FIG. 2 where it is noted that the friction coefficient of the Mo+N layers starts first at 0.1 to 0.11 to rapidly drop to 0.09 and 0.07 while the Cr+N layers have a friction coefficient very constant with time of 0.1 to 0.11 independently of their content in N. In the case of the Mo+N layers, it was noted that these having a hardness of about 2000 VH provide apparently the best results. The easy friction on the plane (1 1 0) can allow a removal of the initial roughness on the surface which explains the decrease of the friction coefficient as a function of time.

These experiments were achieved on a "pin-and-disc" machine using a sapphire ball as "pin" lubricated with an ordinary machine oil.

I claim:

1. A method for obtaining a ductile, polycrystalline, cubic-centered Mo or W coating comprising magnetron cathode sputtering a Mo or W target onto a substrate in the presence of a nitrogen atmosphere such that a solid solution of Mo or W plus nitrogen is formed on the substrate, the nitrogen not exceeding 2% by weight of the coating.

2. The method of claim 1 wherein the nitrogen pressure is below about 0.2 Pa during sputtering.

3. The method of claim 1 wherein the temperature of the substrate is below about 300° C. during sputtering.

4. The method of claim 1 which comprises sputtering a W target onto the substrate.

5. The method of claim 1 wherein the nitrogen pressure is above about 0.12 Pa during sputtering.

* * * * *